United States Patent

Naffziger et al.

[11] Patent Number: 5,815,432
[45] Date of Patent: Sep. 29, 1998

[54] SINGLE-ENDED READ, DUAL-ENDED WRITE SCRAM CELL

[75] Inventors: Samuel D. Naffziger; Kevin X. Zhang, both of Fort Collins, Colo.

[73] Assignee: Hewlett-Packard Company, Palo Alto, Calif.

[21] Appl. No.: 891,173

[22] Filed: Jul. 10, 1997

[51] Int. Cl.⁶ .............. G11C 11/00; G11C 7/00; G11C 8/00
[52] U.S. Cl. ............ 365/154; 365/156; 365/189.02; 365/230; 365/230.02
[58] Field of Search .................. 365/154, 156, 365/189.02, 203, 230.02

[56] References Cited

U.S. PATENT DOCUMENTS

| | | | |
|---|---|---|---|
| 3,992,703 | 11/1976 | Luisi et al. | 365/156 |
| 5,034,923 | 7/1991 | Kuo et al. | 365/154 |
| 5,642,325 | 6/1997 | Aug | 365/154 |
| 5,699,292 | 12/1997 | Roberts | 365/154 |

*Primary Examiner*—David C. Nelms
*Assistant Examiner*—Trong Pham

[57] ABSTRACT

A static random-access memory (SRAM) cell with one or more storage elements connected to a sensing component by a single transmission line. Each storage element is connected to the transmission line through a switch so that one storage element at a time can be actively connected to the transmission line. The sensing component produces an output indicating the value stored in the active storage element then switched onto the transmission line.

8 Claims, 7 Drawing Sheets

SINGLE-ENDED READ, DUAL-ENDED WRITE SCRAM CELL

FIELD OF THE INVENTION

The present invention relates generally to the field of static random-access memory (SRAM), and more particularly to a system and method for constructing an SRAM cell with a fast, monotonic single-wire read path.

BACKGROUND OF THE INVENTION

SRAM cells are known in the art for storing a digital bit value and allowing that value to be written and read back. SRAM cells are used in many electronic applications requiring data storage, such as in the internal cache memory of a microprocessor.

SRAM cells generally comprise one or more storage elements and circuitry to read and write digital bit values to the storage elements. The storage elements are connected to read and write circuitry by wires called bitlines. Storage elements indicate the stored bit value to the read circuitry by causing the voltage on the bitlines to change, or slew, from ground up to the supply voltage or from the supply voltage down to ground. A full voltage change is referred to as a rail-to-rail slew.

In order to create high density memories requiring little space, storage elements are often made with the fewest and smallest parts possible. As a result, storage elements generally do not have the power to cause fast rail-to-rail slews on the bitlines. In order to avoid the unacceptably long delays created by waiting for a simple storage element to cause a full rail-to-rail voltage slew on a bitline, prior art SRAM cells have required two bitlines which slew apart and a differential amplifier, or sense amp. The sense amp determines the stored value after only a partial slew on the bitlines, without waiting for a full rail-to-rail slew. The sense amp compares the two bitlines and can determine which has a larger voltage when there are only very small voltage differences between them. The sense amp compares the two bitlines when it is triggered by a delayed clock line. This delay is calculated as the worst-case amount of time it takes for a storage element to cause the bitlines to slew apart enough for the sense amp to detect the difference. Unlike the storage element, the sense amp is large enough to quickly drive voltage changes, or state changes, to subsequent circuits.

The use of sense amps imposes large size and component count burdens, both in the circuitry of the sense amp and in the delay circuitry. In order to reduce the size of the overall memory circuitry, the minimum possible number of sense amps is used. This is done by placing as many storage elements as possible on one pair of bitlines with one sense amp. This has the undesirable side effect of loading down the bitlines, slowing voltage changes, forcing the worst-case delay of the sense amps to be drawn out even further. It also inhibits simultaneous reads of the storage elements which share one pair of bitlines.

Many memory applications require multiple simultaneous read operations of a single storage element, necessitating the addition of extra ports to SRAM cells. In the prior art SRAM cells, each additional port requires another pair of bitlines with their associated sense amp and delay circuitry. The penalty for adding additional ports is thus a large increase in the size of the SRAM circuitry and in the required number of FET's. Adding additional ports also slows each individual read operation. As the storage element is loaded down by additional bitlines, the worst-case delay of the sense amp clock must be increased.

It would be desirable to provide an SRAM cell which increases speed and reduces size and the number of required components, while allowing the simple addition of extra ports. The present invention achieves all of these goals.

SUMMARY OF THE INVENTION

The size and component count required for an SRAM cell is reduced by providing a simpler method and apparatus for sensing the value stored in the storage element. One or more storage elements may be switchably connected to a single transmission line through independently controlled switches so that one storage element at a time can be electrically connected to the transmission line through its associated switch. When a storage element has been electrically connected to the transmission line, a sensing component produces an output indicating the value stored in the storage element based solely upon the transmission line input.

A value may be written to one or more storage elements by switchably connecting a voltage source to the transmission line to force a new value into the storage element(s) when they are electrically connected to the transmission line through their associated switches. In a preferred embodiment, each storage element has two Input/Output (I/O) ports—an I/O port and an inverse I/O port. Two read ports are provided by connecting one transmission line to the I/O port and a second transmission line to the inverse I/O port. Each of the two read ports have a sensing component connected to them to allow a stored value to be read by each read port independently and simultaneously if desired. In this preferred embodiment values are written to one or more of the storage elements using both of the two I/O ports. The first and second transmission lines are each switchably connected to ground so that a voltage level approximately equal to ground, representing a value of 0, may be forced into either the I/O port or the inverse I/O port to store either a 0 or a 1 in one or more storage elements.

BRIEF DESCRIPTIONS OF THE DRAWING

The objects and advantages of the invention will become more apparent and more readily appreciated from the following detailed description of the presently preferred exemplary embodiment of the invention taken in conjunction with the accompanying drawings, of which:

Like reference numbers in the drawings indicate identical or functionally equivalent elements.

DETAILED DESCRIPTION OF THE EMBODIMENTS

In this disclosure, when elements are referred to as being "electrically connected," this means that an electrical signal may pass from one element to another. This is in distinction to a physical connection. For example, in the description below, a storage element may be physically connected to a sensor by wires and transistors, but no signal will pass from the storage element to the sensor because the transistor is turned off, blocking the electrical signal.

It should be understood that the specific embodiments of the invention shown in the figures and described herein are exemplary. They are intended to show preferred examples of the invention so that those skilled in the art can fully understand and use it. It is not intended to limit the invention to the specific examples shown and described herein.

Figure 1:
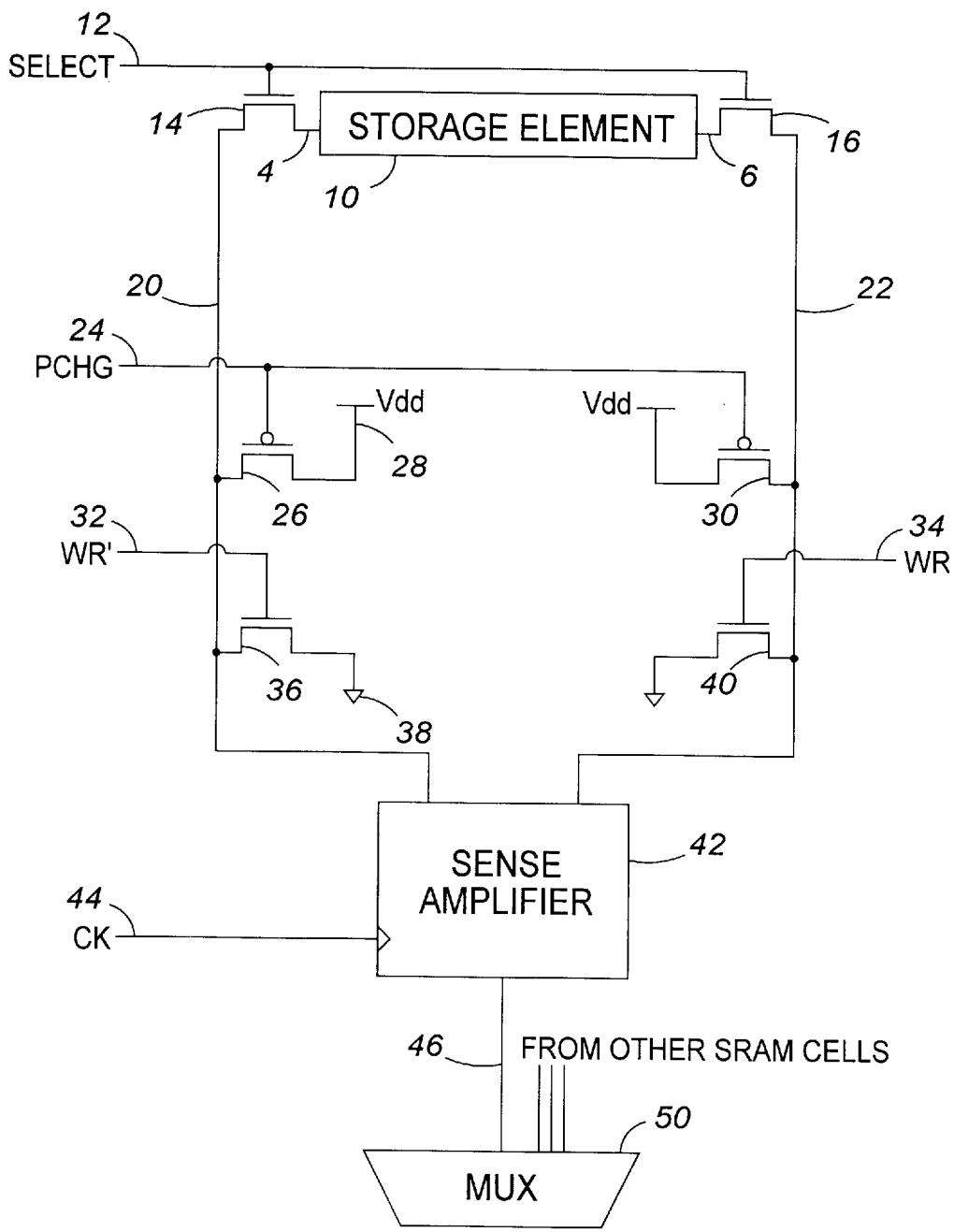
FIG. 1 is a partial block circuit diagram of an exemplary prior art single-port SRAM cell.
Figure 2:
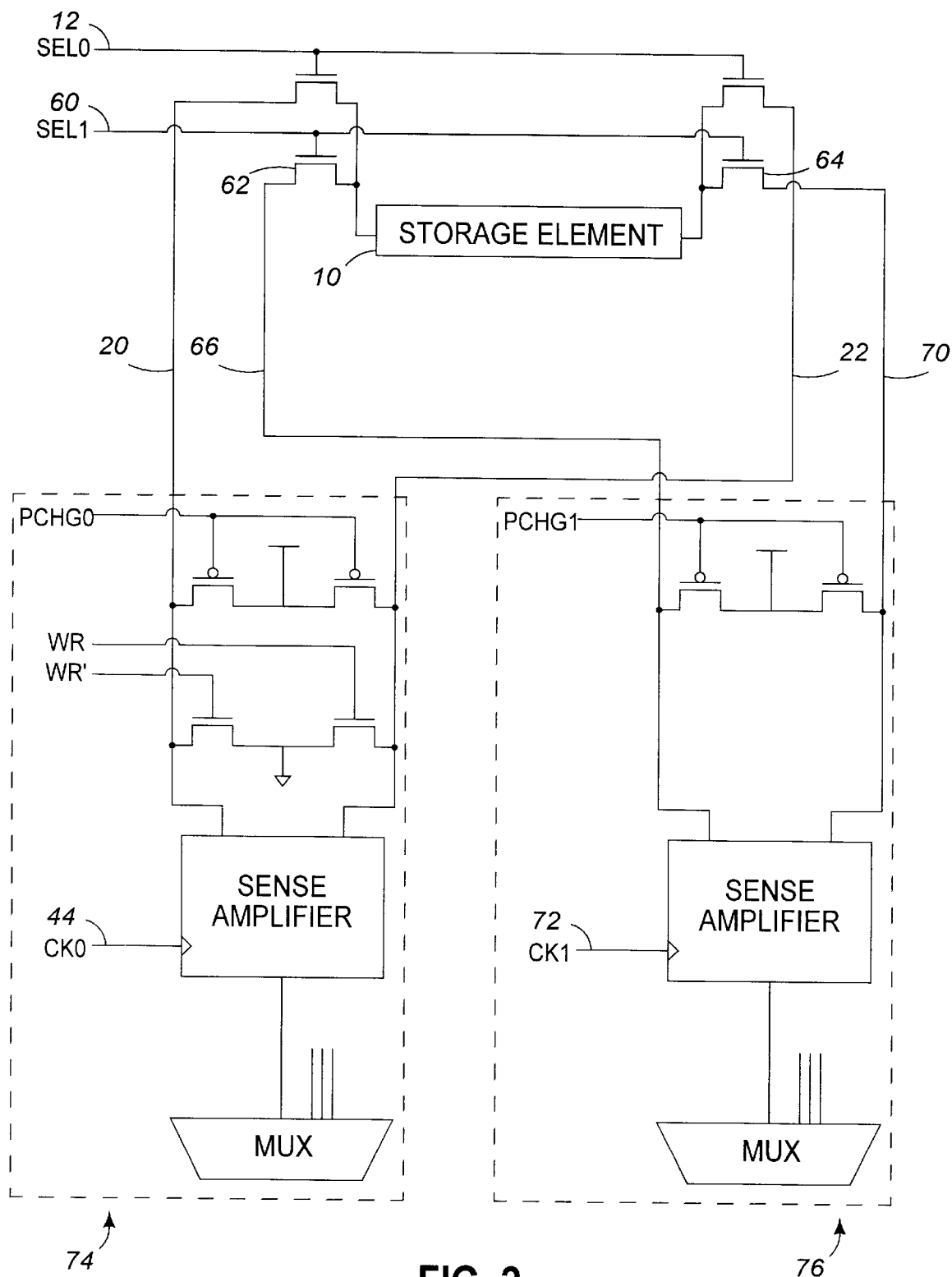
FIG. 2 is a partial block circuit diagram of an exemplary prior art dual-port SRAM cell.
Figure 3:
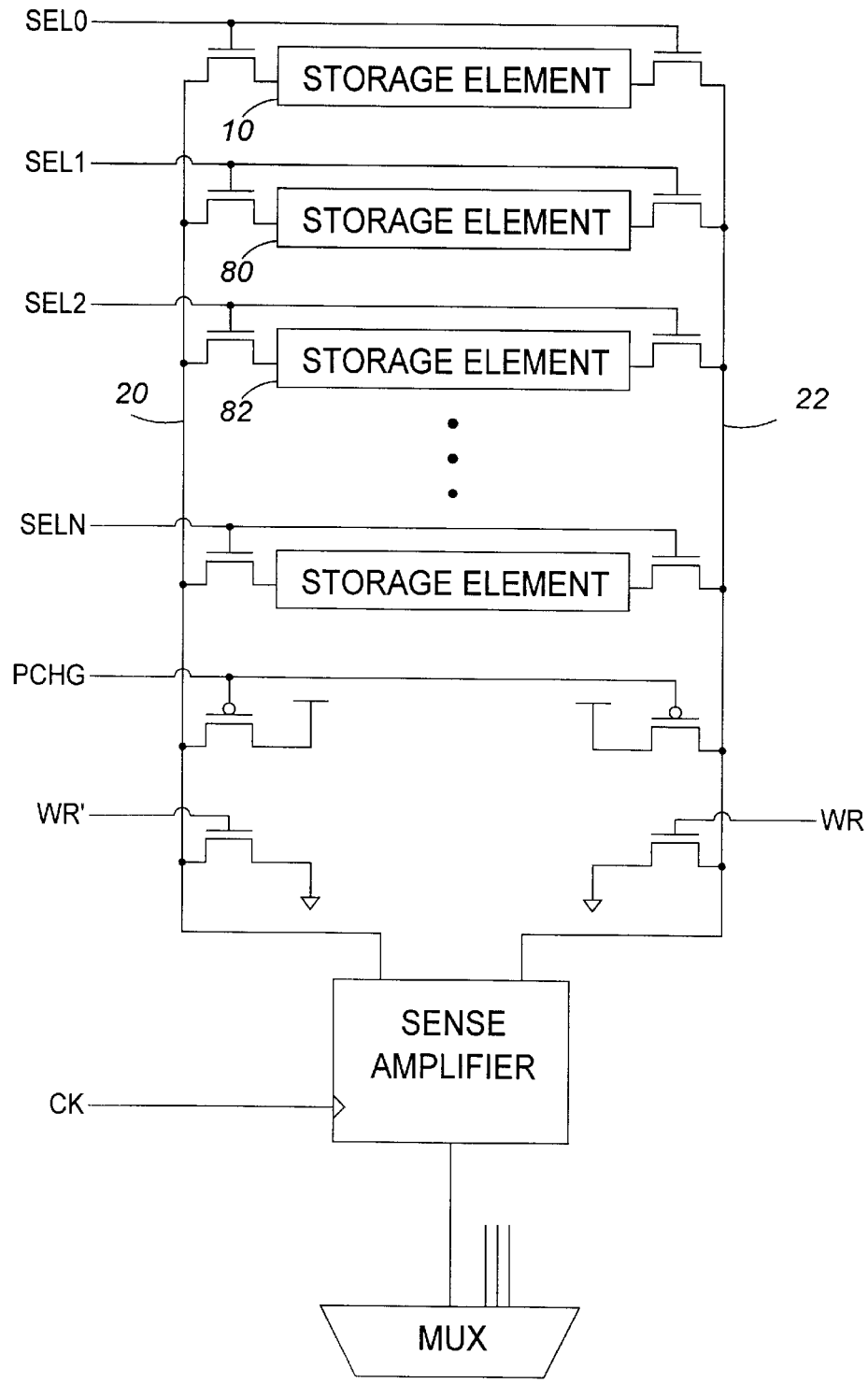
FIG. 3 is a partial block circuit diagram of an exemplary prior art single-port SRAM cell with multiple storage elements.

The present invention may best be understood with reference to the prior art, as illustrated in FIGS. 1–3.

FIG. 1 illustrates a prior art SRAM cell. The supply voltage of the prior art SRAM cell is typically substantially greater than 2 volts, such as a 5 volt supply or a 3 volt supply.

A bit value is stored in the storage element 10. Storage element 10 has two input/output (I/O) port's 4, 6 which at any given time have values which are inverse to one another. Storage element 10 is generally as small and simple as possible to reduce the overall size of the memory circuitry. In perhaps the simplest configuration, storage element 10 may comprise as few as four Field-Effect Transistors (FET's). Generally, the larger the FET or the more FET's that are used, the more power they have to drive rapid voltage changes on connection wires. When reading from a storage element comprising only four FET's, a single FET must cause each bitline to slew. Consequently, storage element 10 is unable to rapidly drive state changes on its outputs.

A select line 12 SELECT is connected to the gates of switch FET's 14 and 16. During a read or a write operation the select line 12 is activated, causing switch FET 16 to connect I/O port 6 of storage element 10 to bitline 22 and switch FET 14 to connect the inverse I/O port 4 of storage element 10 to bitline 20.

Values are written to the storage element 10 by write lines 32 WR' and 34 WR which activate pulldown FET's 36 and 40, respectively. Either write line 32 or write line 34 is activated depending on what value is to be written. To write a 1 to the storage element 10 the inverse I/O port 4 is pulled to ground, to write a 0 the non-inverse I/O port 6 is pulled to ground. Note that in this disclosure, ground is shown as a triangle, as at 38. The supply voltage, Vdd, is shown as a horizontal line making a 'T', as at 28.

Prior art SRAM cells are often monotonic, in that the operation of the cells is divided into two clock states—a precharge state and an evaluate state. In a monotonic system, read and write operations occur only during the evaluation state. During the precharge state the bitlines are precharged to a logic high state to increase speed, since it can be faster to pull a line down to ground than to pull it up to Vdd. The precharge line 24 PCHG in FIG. 1 is activated and pullup FET's 26 and 30 connect bitlines 20 and 22 to Vdd to precharge them high. During the evaluate state the precharge line 24 is deactivated, turning off pullup FET's 26 and 30. Thus during a read operation storage element 10 will only have to pull either bitline 20 or 22 to a logic low, leaving the other in its precharged logic high state.

Values are read from the storage element 10 by disabling the precharge line 24 and activating select line 12 to connect the storage element 10 to bitlines 20 and 22. The prior art SRAM cell is a dual-ended read system, requiring examination of two bitlines to determine the value transmitted from the two inverse I/O port's 4 & 6 of storage element 10. As the storage element 10 is connected to the bitlines 20 and 22, one of the bitlines 20 or 22 will be pulled down toward ground while the other is left in its precharged high state, depending on the value of the stored bit. A sense amplifier 42 is used to detect differences of only several hundred millivolts between the two bitlines 20 and 22, resulting in a digital output on line 46. Waiting for a simple storage element 10 to pull the bitlines 20 and 22 all the way from a large supply voltage Vdd down to ground adds an undesirable delay. By using a sense amplifier, the bit value on the bitlines 20 and 22 can be read without waiting for one of the bitlines 20 or 22 to slew all the way from Vdd to ground. The sense amplifier 42 is activated by a clock line 44 CK which is hard-wired to delay a certain amount of time from the beginning of the read operation. This length of time is precalculated as the worst-case time it takes for bitlines 20 and 22 to slew down several hundred millivolts from the supply voltage, enabling the sense amplifier 42 to reliably detect the difference.

The slew of several hundred millivolts that sense amplifier 42 requires to detect the difference is not reduced by a reduction of the supply voltage level. This minimum slew level is fixed by noise and transistor matching factors.

The output line 46 of sense amplifier 42 is generally connected to a multiplexer 50 together with the output of other SRAM cells, allowing different memory locations to be read using address circuitry not shown, in configurations well-known to persons having ordinary skill in the art.

The prior art SRAM cell is a single-port SRAM, allowing only one read operation at a time. SRAM cells are often extended to allow multiple read operations simultaneously. FIG. 2 illustrates a prior art dual-port SRAM cell, which allows two simultaneous read operations. The addition of a second port requires the addition of second select line 60 SEL1 with switch FET's 62 and 64, two new bitlines 66 and 70, and a second group of read and precharge circuitry 76. The storage element 10 can thus be read by two different ports independently by activating select line 12 to read the stored bit value via circuitry group 74 or by activating select line 60 to read via circuitry group 76. Since the SRAM cell could be read by both ports simultaneously, storage element 10 may be required to pull bitlines 20 and 66 or 22 and 70 to ground at any given time. With two bitlines attached to each I/O port 4 or 6 of storage element 10 rather than one, the size of the wiring is increased, increasing the capacitance and requiring more power to drive a state change. Since the burden on storage element 10 is increased, voltage slews more slowly. Therefore, the hardwired worst-case delay of clock lines 44 and 72 must be made even longer.

To reduce the size of the overall memory system, the number of sense amps is minimized as shown in FIG. 3 by connecting multiple storage elements 10, 80, 82 etc. to a single pair of bitlines 20 and 22 with their associated write, precharge, and sense amp circuitry. However, the use of double-ended bitlines with their associated sense amps is not ideal due to the size penalty. Minimizing this penalty by attaching many storage elements to each sense amp imposes speed penalties which somewhat offset the benefit of using sense amps. As each new storage element is added to a pair of bitlines, the capacitance of the system increases and voltage changes slow.

Therefore, the use of sense amps to improve the speed of the system increases the size. Reducing this increased size by minimizing the number of sense amps slows the system again, offsetting the speed benefit of sense amps. Adding extra ports in a system with sense amps and two bitlines greatly increases size and slows the system further. There remains a need for a faster and smaller SRAM cell with the ability to easily add ports.

The present invention achieves these goals partly by providing a simpler method and apparatus for sensing the bit value in the storage element as described in detail below.

Figure 4:
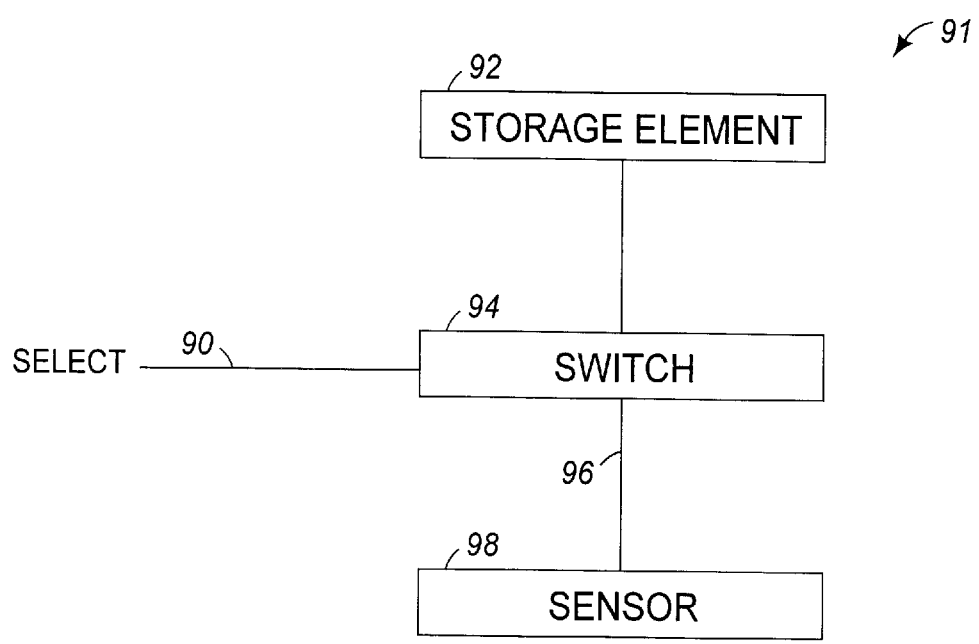
FIG. 4 is a block diagram of a single-port SRAM cell in accordance with the present invention with one storage element.

FIG. 4 shows an SRAM cell 91 in accordance with the present invention. SRAM cell 91 has one storage element and a single port, comprising a storage element 92 switchably connected to a bitline 96 through a switch 94. The switch 94 is activated by a select line 90 SELECT. The stored value in the storage element 92 is determined by a sensor 98 based solely on the state of bitline 96.

Figure 5:
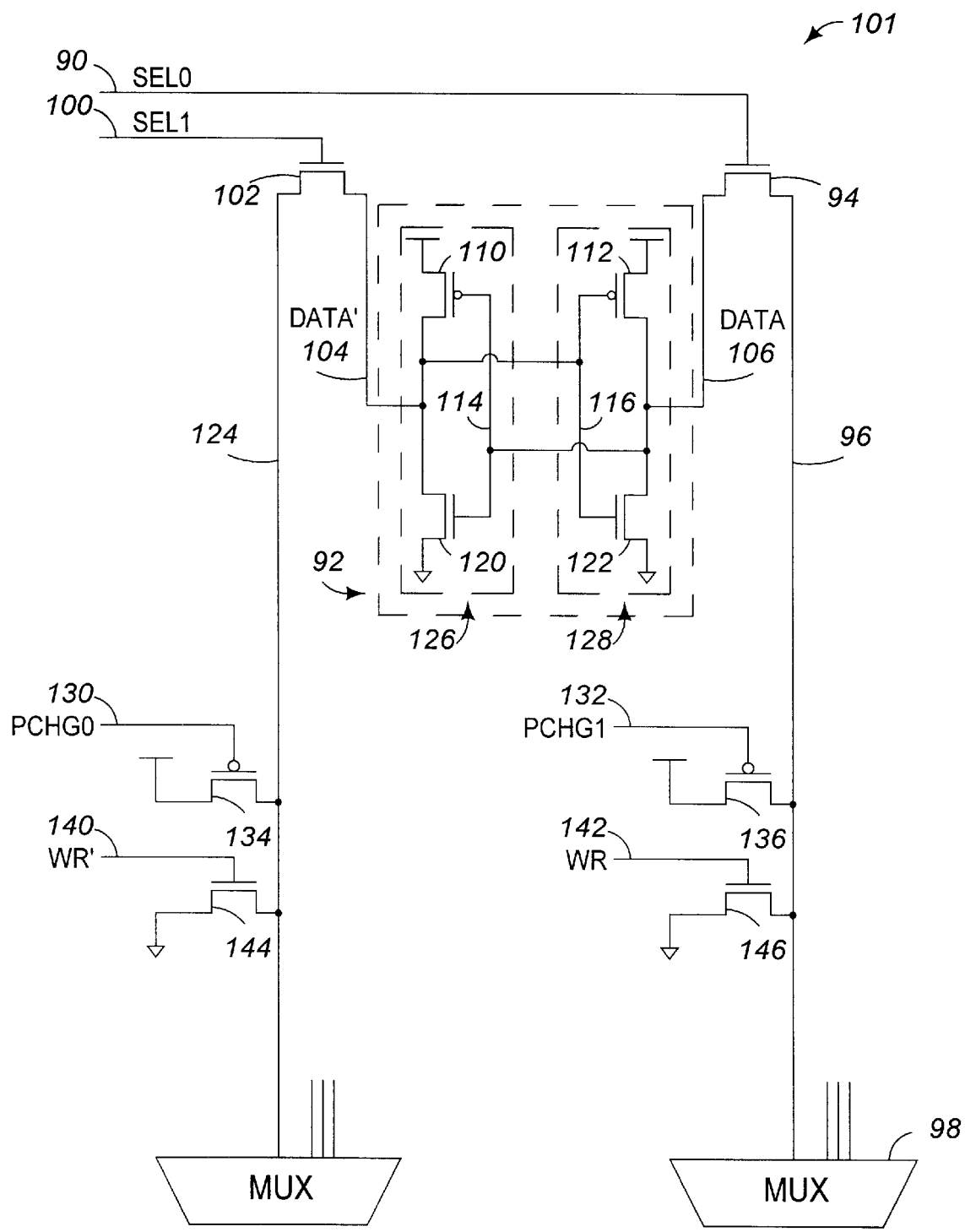
FIG. 5 is a partial block circuit diagram illustrating one hardware embodiment of a dual-port SRAM cell in accordance with the present invention with one storage element.

FIG. 5 shows a monotonic, single-ended read, dual-ended write dual port SRAM cell 101, according to the present invention, with one storage element. The supply voltage of this SRAM cell 101 is preferably less than approximately 2 volts. Note that in this disclosure, the phrase "logic high" indicates a voltage level substantially equal to the supply voltage Vdd and is interpreted as a value of 1 . The phrase "logic low" indicates a voltage level substantially equal to ground, or 0 volts, and is interpreted as a value of 0.

The storage element 92 is made up of four FET's 110, 112, 120, and 122 which form a pair of inverters 126 and 128. Inverters 126 and 128 operate to provide the logical inverse of their inputs 114 and 116 as follows. As the input 114 of the first inverter 126 becomes a logic high, pullup FET 110 turns off and pulldown FET 120 turns on, connecting the output 104 to ground and resulting in a logic low. As the input 114 becomes a logic low, pulldown FET 120 turns off and pullup FET 110 turns on, connecting the output 104 to the supply voltage (Vdd) resulting in a logic high. Output 106 is referred to as DATA and output 104 is referred to as DATA', where DATA' is the logical inverse of DATA.

The pair of inverters 126 and 128 operate together in a loop to store the bit value. Output 104 of the first inverter 126 is connected to input 116 of the second inverter 128. Output 106 of the second inverter 128 is connected to input 114 of the first inverter 126. For example, when inverter 126 has a logic high on input 114, a logic low results on output 104 of inverter 126 and input 116 of inverter 128. When the logic low appears on input 116 of inverter 128, a logic high results on output 106, reinforcing the logic high which started the loop on input 114 of the first inverter 126. As long as power is applied to the cell the bit value will be held in the loop.

A select line 90 SEL0 operates switch FET 94 to electrically connect storage element 92 output 106 DATA to bitline 96 for read and write operations, and to disconnect storage element 92 from bitline 96 for precharge operations. A select line 100 SEL1 operates switch FET 102 to similarly electrically connect storage element 92 output 104 DATA' to bitline 124.

The presently preferred SRAM cell embodiment shown in FIG. 5 is a monotonic system, divided into two clock states—a precharge state and an evaluate state. Precharge lines 130 PCHG0 and 132 PCHG1 are activated to connect bitlines 124 and 96 to Vdd through pullup FET's 134 and 136, respectively, during the precharge state. Read and write operations take place during the evaluate state.

The SRAM cell embodiment of FIG. 5 is a dual-ended write system, using two bitlines. With the storage element 10 containing two inverters 126, 128 as described above, writing a new bit value can be accomplished by pulling down on the input of either inverter, depending on the value to be stored.

For example, to write a logic low value to the storage element 10, precharge line 132 PCHG1 is disabled, then write line 142 WR is activated, connecting bitline 96 to ground through pulldown FET 146. Select line 90 SEL0 is also activated, connecting bitline 96 to input 114 of the first inverter 126 to change the value in the storage loop. During the first part of the write operation, pullup FET 112 of the second inverter 128 will still be on, attempting to hold input 114 of the first inverter 126 at a logic high state. Accordingly, pulldown FET's 144 and 146 are sized larger than pullup FET's 110 and 112 so that the pulldown FET's will overpower the pullup FET's during write operations. To write a logic high value to the storage element 10, precharge line 130 PCHG0 is disabled, then write line 140 WR' is activated, connecting bitline 124 to ground through pulldown FET 144. Select line 100 SEL1 is also activated, connecting bitline 124 to input 116 of the second inverter 128 to change the value in the storage loop to a logic high.

The SRAM cell embodiment of FIG. 5 is a single-ended read system, requiring only one bitline. Although two bitlines 124 and 96 are shown to enable writing a new value to storage element 10, writing could be accomplished in various other manners without the need for two bitlines, such as using the precharge pullup FET 136 to write a logic high value along with using pulldown FET 146 to write a logic low value. The present invention requires only a single bitline for a read operation. For example, to read the DATA value from storage element 10, select line 90 is activated, connecting output 106 to bitline 96 through switch FET 94. The supply voltage of storage element 10 is preferably substantially less than 2 volts, and bitline 96 is allowed to slew down from the supply voltage to a trip point of a sensor, such as an inverter or a multiplexer such as mux 98, shown in FIG. 5, may detect the bit value. The trip point of a typical component is about 60–70% of the supply voltage. By using a multiplexer which is typically already included in SRAM circuitry, the size restrictions of prior art sense amps are avoided. Therefore, the number of storage elements connected to a bitline can be reduced, increasing the slew rate. For a system with sufficiently few storage elements per bitline, the present invention can operate faster than SRAM cells using prior art sense amps and delay circuitry, and require fewer components and wires.

The SRAM cell shown in FIG. 5 may be constructed with the following relative FET sizes:

| FET | Size |
| --- | --- |
| 94 | 3 |
| 102 | 3 |
| 110 | 1 |
| 112 | 1 |
| 120 | 5 |
| 122 | 5 |
| 134 | 3 |
| 136 | 3 |
| 144 | 3 |
| 146 | 3 |

Figure 6:
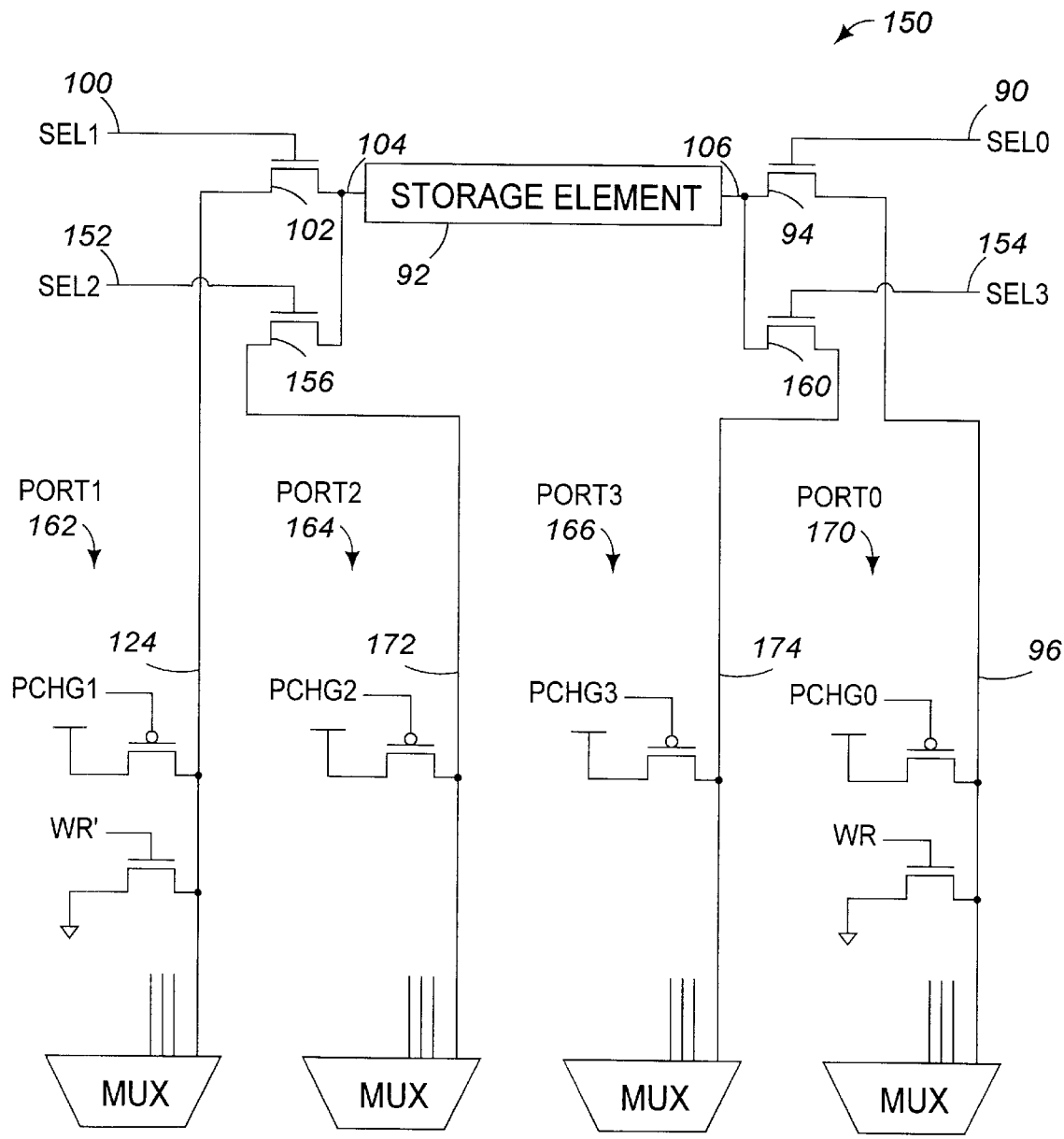
FIG. 6 is a partial block circuit diagram illustrating one hardware embodiment of a quad-port SRAM cell in accordance with the present invention with one storage element.

Additional ports may be added as exemplified by the quad-port SRAM cell 150 of FIG. 6. Each new port requires the addition of a select line, switch FET, bitline and precharge circuit. Note that only two of the bitlines in this example need write circuitry, one for each I/O port 104 & 106 of storage element 92. PORT0 170 and PORT1 162 may be identical to circuitry in SRAM cell 101 described in FIG. 5 above. An extra port PORT2 164 is shown, requiring select line SEL2 152, switch FET 156, bitline 172 and associated precharge circuitry. Bitline 172 does not require write circuitry, since write circuitry for I/O port 104 is included on bitline 124. An extra port PORT3 166 is also shown, requiring select line SEL3 154, switch FET 160, bitline 174 and associated precharge circuitry. Bitline 174 does not require write circuitry, since write circuitry for I/O port 106 is included on bitline 96.

Figure 7:
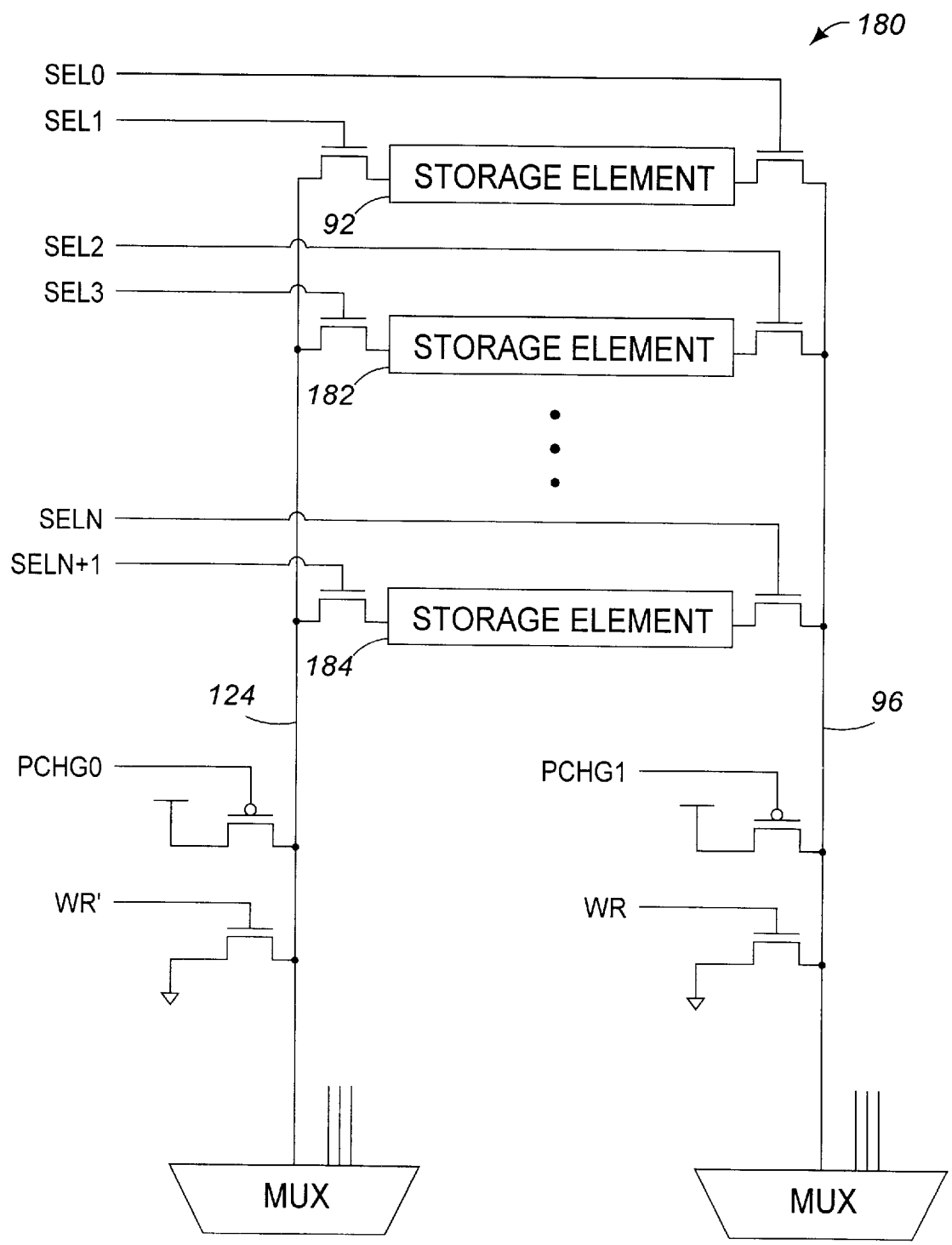
FIG. 7 is a partial block circuit diagram illustrating one hardware embodiment of a dual-port SRAM cell in accordance with the present invention with multiple storage elements.

FIG. 7 shows an SRAM cell 180 which may be identical to SRAM cell 101 described in FIG. 5 above except that it contains multiple storage elements 92, 182 and 184 connected to the pair of bitlines 124 and 96. The number of storage elements per pair of bitlines can be optimized for a desired balance of size versus speed for the overall memory circuitry. With sufficiently few storage elements per pair of bitlines, the present SRAM cell is faster and smaller than SRAM cells in the prior art.

While illustrative and presently preferred embodiments of the invention have been described above, it should be understood that the inventive concepts may be otherwise variously embodied and employed and that the appended claims are intended to be construed to include such variations except insofar as limited by the prior art.

What is claimed is:

1. A storage memory comprising:

a plurality of bitlines;

a storage element for holding a stored value, said storage element comprising first and second I/O ports which at any given time hold output values that are inverse to one another;

a plurality of independently controlled select switches, each coupled to a different respective one of said plurality of bitlines, and each responsive to a different respective one of a plurality of select signals to couple its respective bitline to one of said first and second I/O ports when said respective select signal is in an active state and to isolate said respective bitline from one said first and second I/O ports when said respective select signal is in an inactive state;

a write mechanism coupled to a first and second bitline of said plurality of bitlines, said first bitline being coupled through a first select switch of said independently controlled select switches to said first I/O port and said second bitline being coupled through a second select switch of said independently controlled select switches to said second I/O port; and a plurality of sensors, each coupled to a different respective one of said plurality of bitlines, and each sensing said stored value based solely upon said stored value coupled to said respective bitline.

2. The storage memory of claim 1, wherein:

said storage element comprises:

a first inverter having an input and an output; and a second inverter having an input and an output;

the output of said first inverter being connected to said first I/O port and to the input of said second inverter, and the output of said second inverter being connected to said second I/O port and to the input of said first inverter.

3. The storage memory of claim 1, wherein:

said write mechanism comprises:

a first write switch responsive to a first write enable signal for coupling said first bitline to a fixed voltage source; and a second write switch responsive to a second write enable signal for coupling said second bitline to said fixed voltage source;

wherein said second write enable signal and said first write enable signal are complementary signals.

4. The storage memory of claim 3, wherein said fixed voltage level is approximately equal to a ground voltage level.

5. The storage memory of claim 1, further comprising:

precharging means for precharging said plurality of bitlines to a fixed precharge voltage level.

6. The storage memory of claim 5, wherein said fixed precharge voltage level is approximately equal to a supply voltage level.

7. The storage memory of claim 1, wherein said sensor comprises a multiplexer.

8. A method for reading a stored value from a storage element, said storage element comprising an I/O port switchably connectable to a single bitline via an independently controlled switch, said method comprising the steps of:

coupling said stored value from said storage element onto said single bitline by activating said independently controlled switch; and sensing said stored value coupled onto said single bitline by detecting an occurrence or lack or occurrence of a rail-to-rail skew on said single bitline.

* * * * *